(12) United States Patent
Hsieh

(10) Patent No.: US 11,316,509 B1
(45) Date of Patent: Apr. 26, 2022

(54) MAINTAINING SAFE OPERATING AREA OPERATION OF TRANSISTORS DURING RAMP UP

(71) Applicant: ZT Group Int'l, Inc., Secaucus, NJ (US)

(72) Inventor: Yung-Tsung Hsieh, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 16/906,347

(22) Filed: Jun. 19, 2020

(51) Int. Cl.
*H03K 17/0812* (2006.01)

(52) U.S. Cl.
CPC ................ *H03K 17/08122* (2013.01)

(58) Field of Classification Search
None
See application file for complete search history.

(56) References Cited

U.S. PATENT DOCUMENTS

| | | | | |
|---|---|---|---|---|
| 6,353,309 B1* | 3/2002 | Ootani | ............ | H03K 17/122 323/282 |
| 7,579,900 B2* | 8/2009 | Durbaum | ........ | H03K 17/0822 327/404 |
| 9,036,314 B2* | 5/2015 | Kanamori | ........... | H02H 9/004 361/93.9 |
| 9,917,437 B2* | 3/2018 | Sun | ................ | H02H 9/004 |
| 10,283,957 B2* | 5/2019 | Donath | ............ | H02M 3/156 |
| 10,418,805 B2* | 9/2019 | Simonson | ........... | H02H 9/004 |
| 10,418,988 B2* | 9/2019 | Morimoto | .......... | H03K 17/693 |
| 10,476,373 B2* | 11/2019 | Yuan | .............. | H03K 17/107 |

* cited by examiner

*Primary Examiner* — Jeffery S Zweizig
(74) *Attorney, Agent, or Firm* — Dergosits & Noah LLP; Todd A. Noah

(57) ABSTRACT

Systems and methods are described for controlling inrush current for a system comprising a plurality of metal-oxide-semiconductor field-effect transistors (MOSFETs). The system may include a control circuit coupled to parallel series of gate drivers, where each gate driver is coupled to a different MOSFET. An inrush current may be received during charging of a capacitor of the switch circuit. During a first period of a ramp time, the control circuit may cause the inrush current to pass through a first gate driver. During a second period of the ramp time, the control circuit may cause the inrush current to pass through a second gate driver. By using a control circuit to cause the inrush current to pass through each MOSFET, a gate-source threshold voltage for the MOSFETs may remain below safe operating areas (SOAs) for the different MOSFETs.

10 Claims, 6 Drawing Sheets

MAINTAINING SAFE OPERATING AREA OPERATION OF TRANSISTORS DURING RAMP UP

TECHNICAL FIELD

Embodiments herein relate generally to switch circuits, and more specifically to controlling inrush current during circuit ramp-up to stay within the safe operating area of the components within the circuit.

SUMMARY OF THE INVENTION

Systems and methods are described for controlling inrush current for a system comprising a plurality of metal-oxide-semiconductor field-effect transistors (MOSFETs). The system may include a control circuit communicatively coupled to a plurality of gate drivers, where each gate driver is communicatively coupled to a gate of a different MOSFET of the plurality of MOSFETs. The MOSFETs may be coupled in parallel within a switch circuit. An inrush current may be received by the control circuit during charging of a capacitor of the switch circuit. During a first period of a ramp time, the control circuit may cause the inrush current to pass through a first MOSFET of the plurality of MOSFETs. During a second period of the ramp time, the control circuit may cause the inrush current to pass through a second MOSFET of the plurality of MOSFETs. By using a control circuit to cause the inrush current to pass through each of the plurality of MOSFETs, a gate-source threshold voltage for each of the different MOSFETs coupled to the first and the second gate drivers may remain below safe operating areas for the different MOSFETs.

BRIEF DESCRIPTION OF THE FIGURES

This disclosure is illustrated by way of example and not limitation in the figures of the accompanying drawings, in which like references indicate similar elements, and in which.

DETAILED DESCRIPTION

In many conventional systems, capacitors are placed at the output of a MOSFET switch circuit to ensure that the output voltage is stable. When the MOSFETs are turned on, the output voltage of the switch circuit ramps up, and charging the capacitors can result in inrush current flowing through the MOSFETs. During this period, the MOSFET SOA (Safe Operating Area) is generally monitored, since the MOSFET is working on its linear region. Conventional MOSFET switch circuit solutions only use a single gate driver to control all of the MOSFETs. Even when multiple identical MOSFETs are implemented in parallel for sharing the operating current of the switch circuit (to reduce the power consumption of any single MOSFET), a single gate driver is used in conventional systems.

Figure 1:
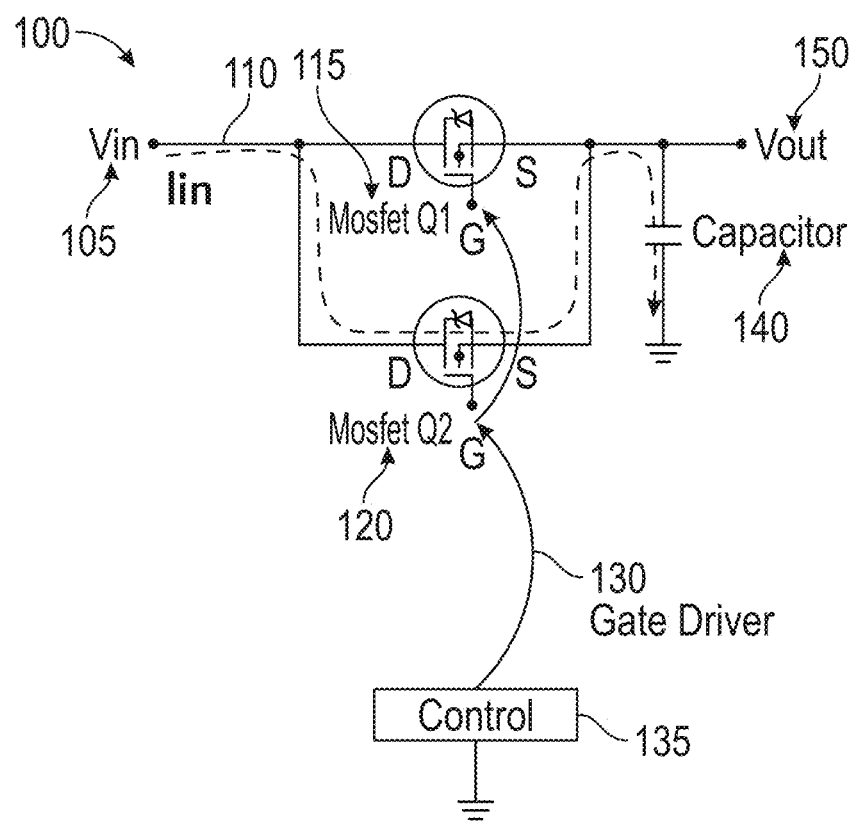
FIG. 1 shows an example of a conventional switch circuit that includes parallel MOSFETs and a single gate driver.
Figure 2:
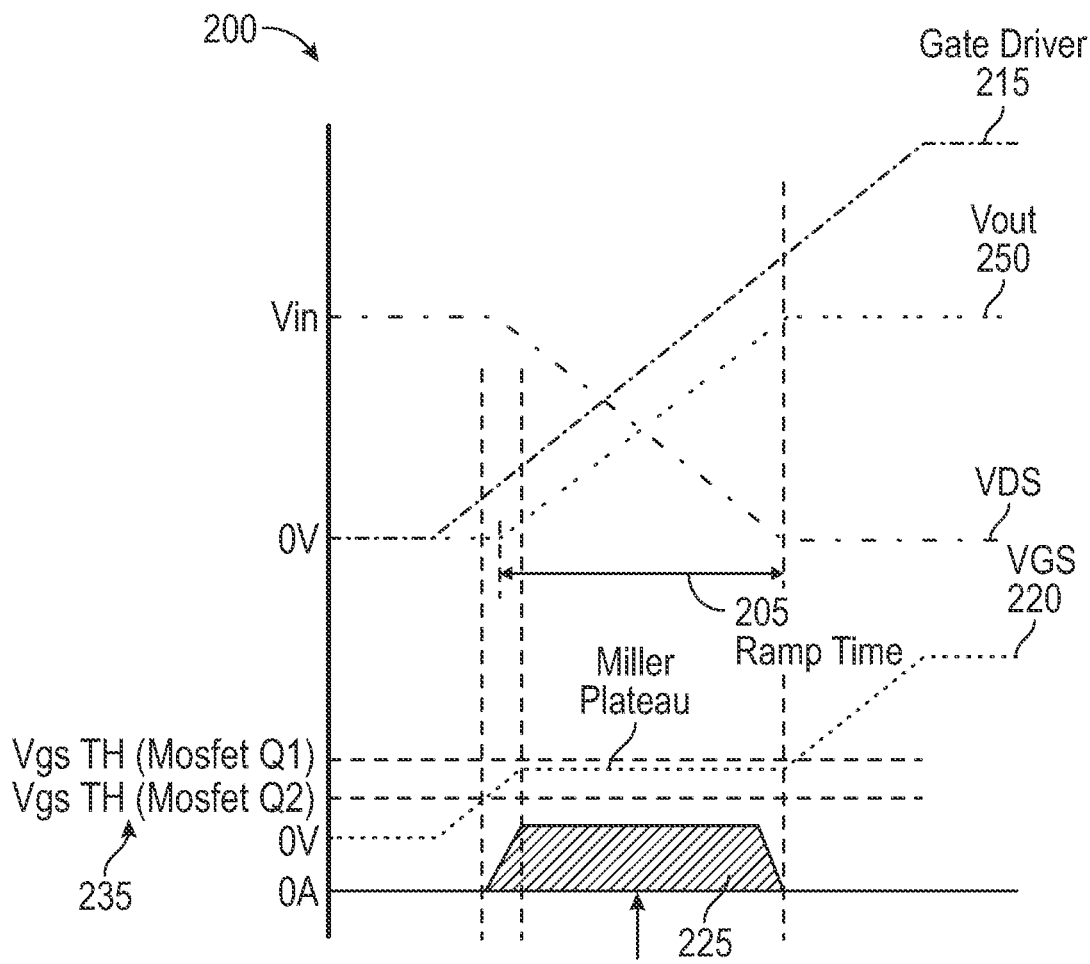
FIG. 2 shows a timing diagram for a ramp-up period for an exemplary conventional switch circuit that includes parallel MOSFETs and a single gate driver.

FIG. 1 shows an example of a conventional switch circuit 100 that includes two parallel MOSFETs 115 and 120 and a signal controller 135 with a single gate driver 130. As shown in switch circuit 100, when input voltage $V_{in}$ 105 is applied to the switch circuit 100 and the MOSFETs 115 and 120 are turned on, inrush current $I_{in}$ flows through the circuit 100 to charge capacitor 140. FIG. 2 shows a timing diagram 200 for a ramp-up time period 205 for an exemplary conventional switch circuit that includes parallel MOSFETs and a single controller with a single gate driver prior to reaching stable output voltage 250 and gate driver operating voltage 215. The ramp time 205, also known as the gate-drain charge period, the gate-source voltage ($V_{GS\_}TH$) stops increasing and reaches the Miller plateau. Because the $V_{GS\_}TH$ of each MOSFET has its own tolerance (due to minor differences created during the manufacturing process, even between MOSFETs having the same type/vendor part number), the gate-source threshold voltage 235 of MOSFET Q2 may be lower than the gate-source threshold voltage of MOSFET Q1. This may cause, during the boundary condition (i.e., during ramp time 205), the inrush current 225 to pass only through MOSFET Q2 when output voltage ramps up. This is also clearly displayed in FIG. 1, where the inrush current $I_{in}$ flows through the MOSFET Q2 120, despite both MOSFETs having the same gate-source voltage.

Figure 7:
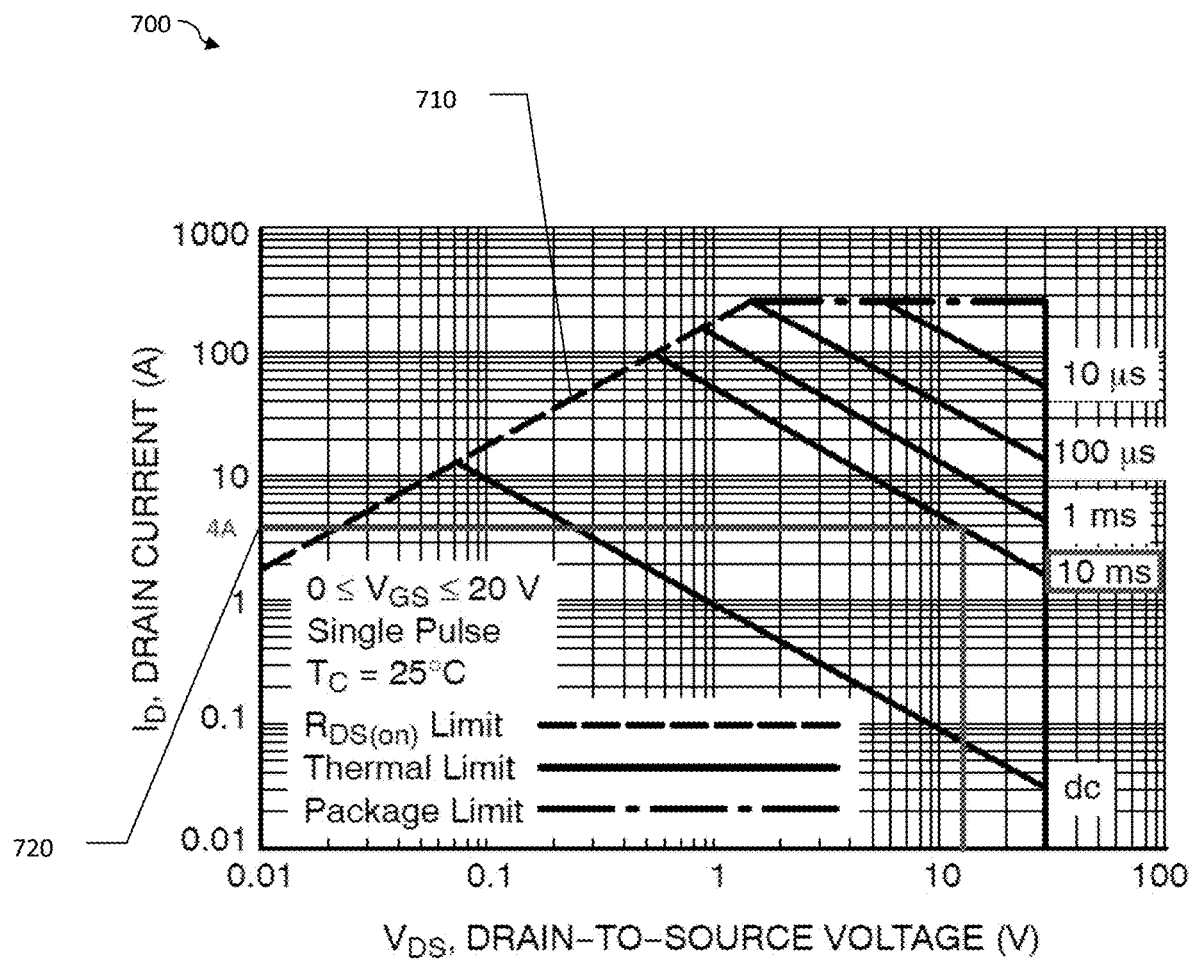
FIG. 7 shows an example of a safe operating area curve of an exemplary MOSFET illustrating if a switch circuit is operating properly, according to an embodiment.

From a design perspective, this is the worst case scenario. During the ramp time 205, the SOA of MOSFET Q2 may be checked to determine if the switch circuit is operating properly. For an example, the SOA curve 700 displayed in FIG. 7 is captured from ON-semi NTMFS4935N MOSFET spec (marketed by ON Semiconductor Corporation, of Phoenix, Ariz., USA). On an exemplary 12 VDS and 10 mS ramp time application (represented by drain current curve 710), the maximum allowance inrush current is 4 A, as indicated by threshold line 720. Returning to FIG. 2, if there is a inrush current 225 over 4 A passing through the MOSFET Q2 during the 10 mS ramp time 205, then the SOA for the MOSFET Q2 is exceeded, which could damage the circuit 100 during the ramp time 205. To prevent the MOSFET Q2 from exceeding its SOA, a different MOSFET with stronger SOA current must be selected or the total load capacitance must be reduced for lower inrush current to avoid damaging the switch circuit during the ramp time. Thus, to avoid compromising either the total system load capacitance (which would reduce output voltage stability) or the MOSFET selection (resulting in a potentially higher cost), a different approach must be used to protect the switch circuit during the ramp time 205.

Figure 3:
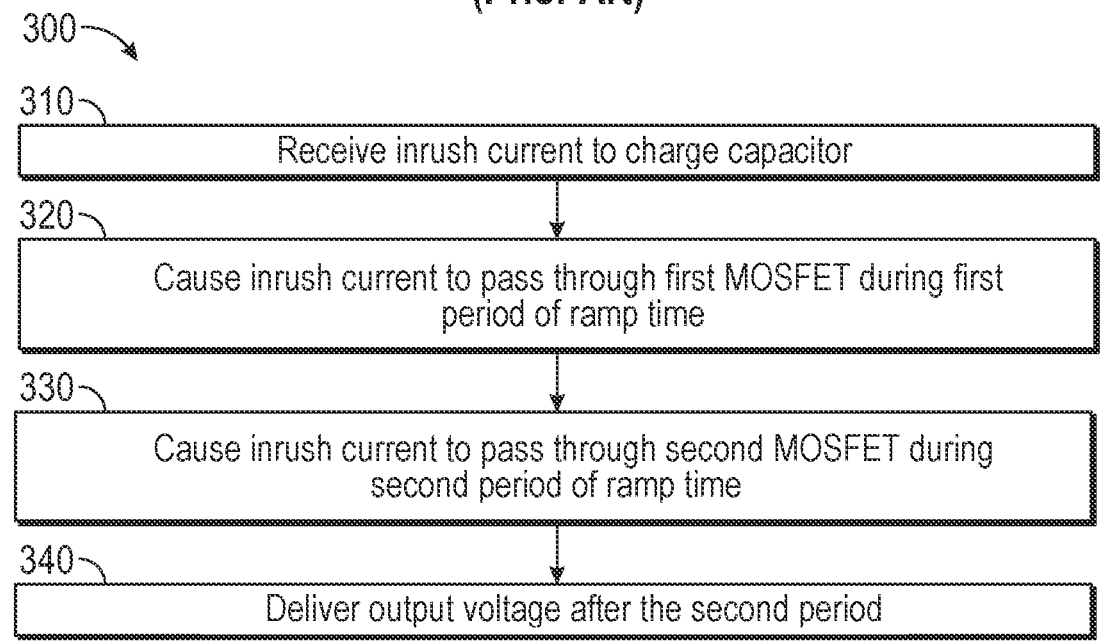
FIG. 3 shows a specific embodiment of a flow diagram for a method of controlling inrush current during circuit ramp-up of a switch circuit that includes parallel MOSFETs and multiple gate drivers.
Figure 4:
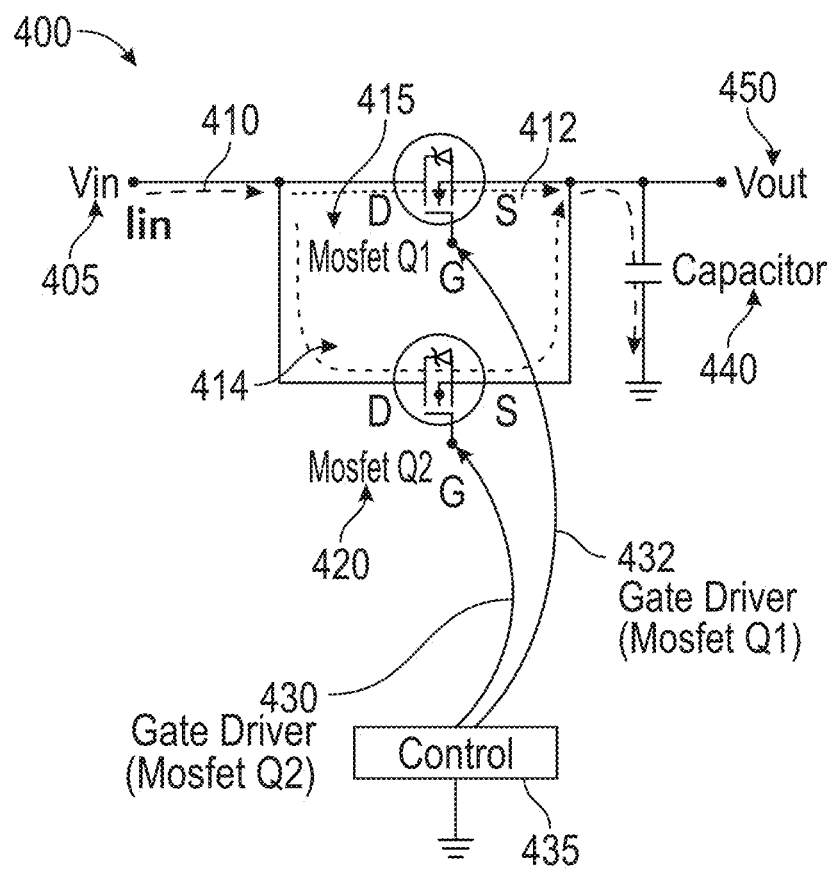
FIG. 4 shows an example of a switch circuit that includes control circuitry for controlling inrush current during circuit ramp-up of a switch circuit that includes parallel MOSFETs and multiple gate drivers, according to an embodiment.

The proposed solution is for the MOSFET switch circuit to use multiple gate drivers with different ramp time to control the multiple MOSFETs. FIG. 3 shows a specific embodiment of a flow diagram for a method 300 of controlling inrush current during circuit ramp-up of a switch circuit that includes parallel MOSFETs and multiple gate drivers. FIG. 4 shows an example of a switch circuit 400 that includes control circuitry 435 for controlling inrush current during circuit ramp-up of a switch circuit that includes parallel MOSFETs 415 and 420 and multiple gate drivers 430 and 432, according to an embodiment. In the example discussed in FIGS. 3 and 4, two gate drivers with different ramp timing are used to control two MOSFETs at the same time, but any number of MOSFETs and gate drivers may be used (e.g., 4 MOSFETs, 6 MOSFETs, etc.), and each gate driver may be used to control one MOSFET or a plurality of MOSFETs.

The exemplary switch circuit 400 receives input voltage $V_{in}$ 405 when the circuit is turned on, resulting in inrush current $I_{in}$ 410 flowing through the switch circuit. The inrush current may be controlled by control circuitry 435, which directs the inrush current $I_{in}$ 410 to pass through both MOSFET Q1 415 and MOSFET Q2 420 as the capacitor 440 is charged. After the ramp time period, the switch circuit 400 outputs output voltage $V_{out}$ 450. Method 300 describes the ramp-up process of switch circuit 400, according to an exemplary embodiment.

As stated above, the input voltage Vin may be applied to the switch circuit 400, and the control circuitry 435 controls the gate driver 432 of MOSFET Q1 415 and gate driver 430 of MOSFET Q2 420 to result in the inrush current 410 through the MOSFET Q1 415 and MOSFET Q2 420 respectively during charging of the capacitor 440 of the switch circuit 400 at step 310. The control circuit 435 may be communicatively coupled to a plurality of gate drivers, depicted as gate driver Q2 430 and gate driver Q1 432 in FIG. 4. Each gate driver may be communicatively coupled to a gate of a different MOSFET of the plurality of MOSFETs coupled in parallel within the switch circuit. This is displayed in FIG. 4, as gate driver Q2 430 is coupled to both the control circuitry 435 and the gate of MOSFET Q2 420. Likewise, gate driver Q1 432 is coupled to both the control circuitry 435 and the gate of MOSFET Q1 415.

Figure 5:
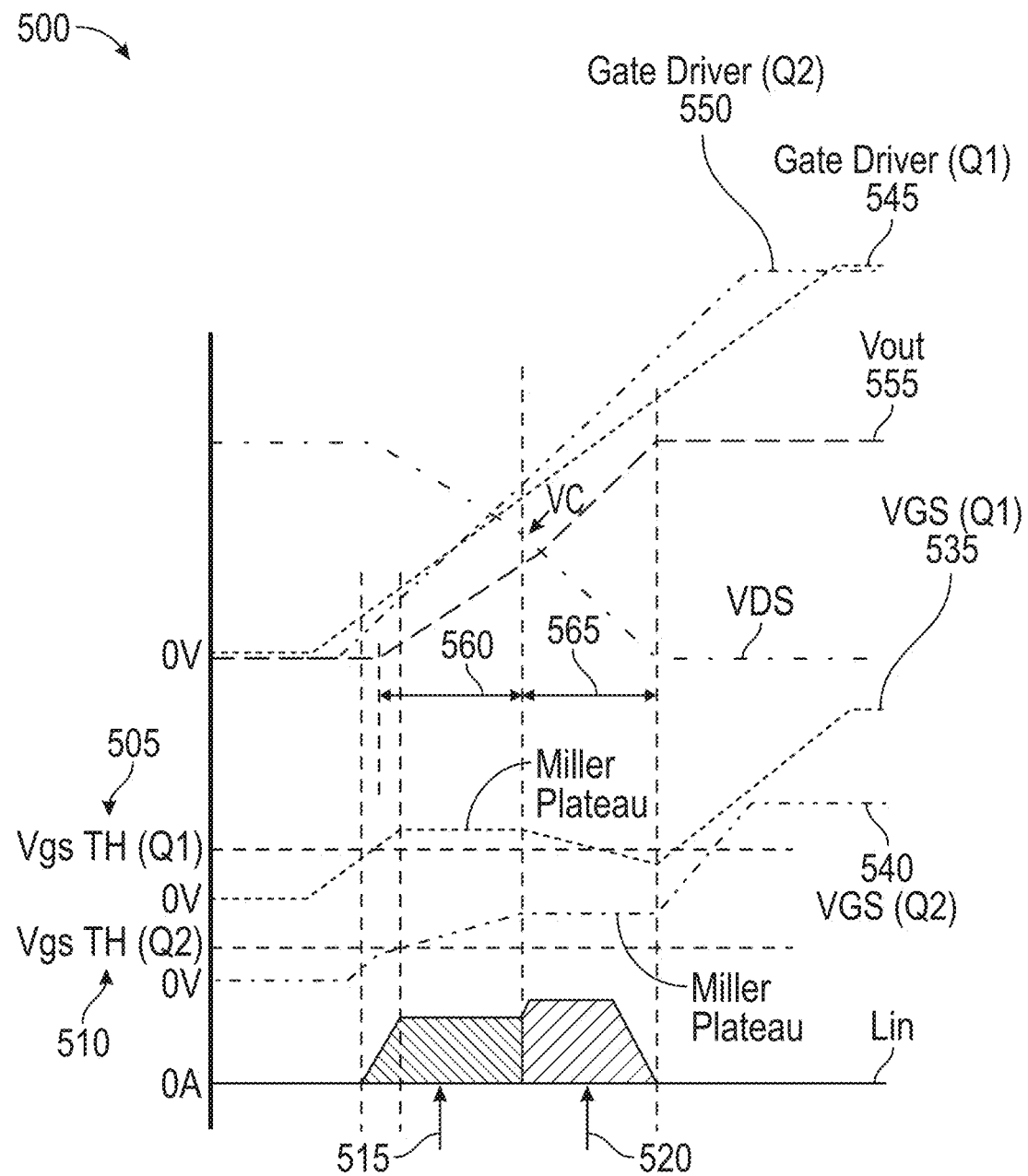
FIG. 5 shows a timing diagram for a ramp-up period for a switch circuit that includes control circuitry for controlling inrush current during circuit ramp-up of a switch circuit that includes parallel MOSFETs and multiple gate drivers, according to an embodiment.

FIG. 5 shows a timing diagram 500 for a ramp-up period for a switch circuit that includes control circuitry for controlling inrush current during circuit ramp-up of a switch circuit that includes parallel MOSFETs and multiple gate drivers, according to an embodiment (e.g., switch circuit 400). As shown in switch circuit 400 and in timing diagram 500, there are two gate drivers, gate driver (Q1) 415 (associated with line 545 in FIG. 5) and gate driver (Q2) 420 (associated with line 550 in FIG. 5), that have different delaying/skewing. The ramp-up period may be divided into two parts. During a first period of the ramp time, the MOSFET Q1 415 may be turned on by the Vgs (Q1) 535 exceeding the Vgs TH (Q1) 505. Since the gate driver (Q1) 545 is controlled by the control circuitry 435 to ramp up before the gate driver (Q2) 550, at step 320 the control circuitry 435 causes the inrush current 515 to pass through the MOSFET Q1 415 during the period 560.

During a second period of the ramp time, the MOSFET Q2 420 may turned on by the $V_{GS}$ (Q2) 540 exceeding the Vgs TH (Q2) 510 at step 330. Because the gate driver (Q2) 550 has a faster skew rate then the gate driver (Q1) 545, there is a higher inrush current 520 through gate driver (Q2) 550 than there is in gate driver (Q1) 545 during second period 565. Also, since the inrush current 520 is gradually passing through the MOSFET Q2 420 during second period 565 at the faster rate, Vout 555 also ramps up rate during second period 565 at a faster rate than first period 560. As a result, the Vgs (Q1) 535 is gradually decreasing to turn off the MOSFET Q1 415 when the Vgs(Q1) 535 falls below the Vgs TH (Q1). The on-resistance of MOSFET Q1 415 is also gradually increased by the control circuitry 435 to further reduce the inrush current 520 passing through the MOSFET Q1 415 during second period 565. Accordingly, the gate-source threshold voltage for each of the different MOSFETs coupled to the first and the second gate drivers remains below safe operating areas for the different MOSFETs during the ramp-up period. The control circuit may accomplish the above-discussed changes using any suitable control method, such as a delay circuit that switches the inrush current from one gate driver to the next based on a predetermined timing.

As discussed above, diagram 500 shows that the inrush current 515 during first period 560 almost entirely passes through the MOSFET Q1. This is manifested as $V_{GS}$ for MOSFET Q1 535 operating at the Miller Plateau during first period 560 (unlike FIG. 2, where $V_{GS}$ for the first MOSFET was operating at 0V throughout the ramp-up period), while the $V_{GS}$ for MOSFET Q2 540 starts at 0V at the start of the first period 560, only increasing near the transition point $V_c$ at the end of the first period 560.

After the transition point, the inrush current 520 almost entirely passes through the MOSFET Q2 during second period 565. Accordingly, $V_{GS}$ for MOSFET Q2 540 operates at the Miller Plateau during second period 5565, while the $V_{GS}$ for MOSFET Q1 535 decreases to 0 V during the second period 565. The ramp up ratio of Q2, displayed as the slope of the plot of the operating voltage of gate driver Q2 550, is faster than the ramp up ratio of MOSFET Q1 (the slope of the gate driver Q1 operating voltage 545). However, the ramp up timing of MOSFET Q1 may be set to be earlier than the ramp up of MOSFET Q2, as shown by the rise of line 545 beginning earlier than the rise of line 550. The ramp up ratios of the gate drivers may be set differently to smooth the overall ramp-up rate, thereby reducing the burden on any single MOSFET during the ramp up period.

Returning to FIGS. 3 and 4, after the ramp up period has ended, the output voltage $V_{out}$ 450 is provided by the switch circuit 400 at step 340. As shown in FIG. 5, controlling the inrush current the manner described above may reduce the power consumption of each MOSFET, which may be checked during the first and second periods of the ramp time to confirm that the MOSFSOA specification has been satisfied. Accordingly, unlike conventional systems, the total system load capacitance and the MOSFET selection in the solutions described herein are not limited by any single MOSFET SOA. By simply adding an additional pin to the switch circuit, where each pin corresponds to a different gate driver, more significant changes to the layout of a circuit board, such as decreasing capacitor size or increasing MOSFET size, may be avoided. This may also have the benefit of conserving valuable board space, as additional gate drivers and control circuitry may take up less space than larger MOSFETs, while preserving the output voltage stability that would be lost with a smaller capacitor.

Figure 6:
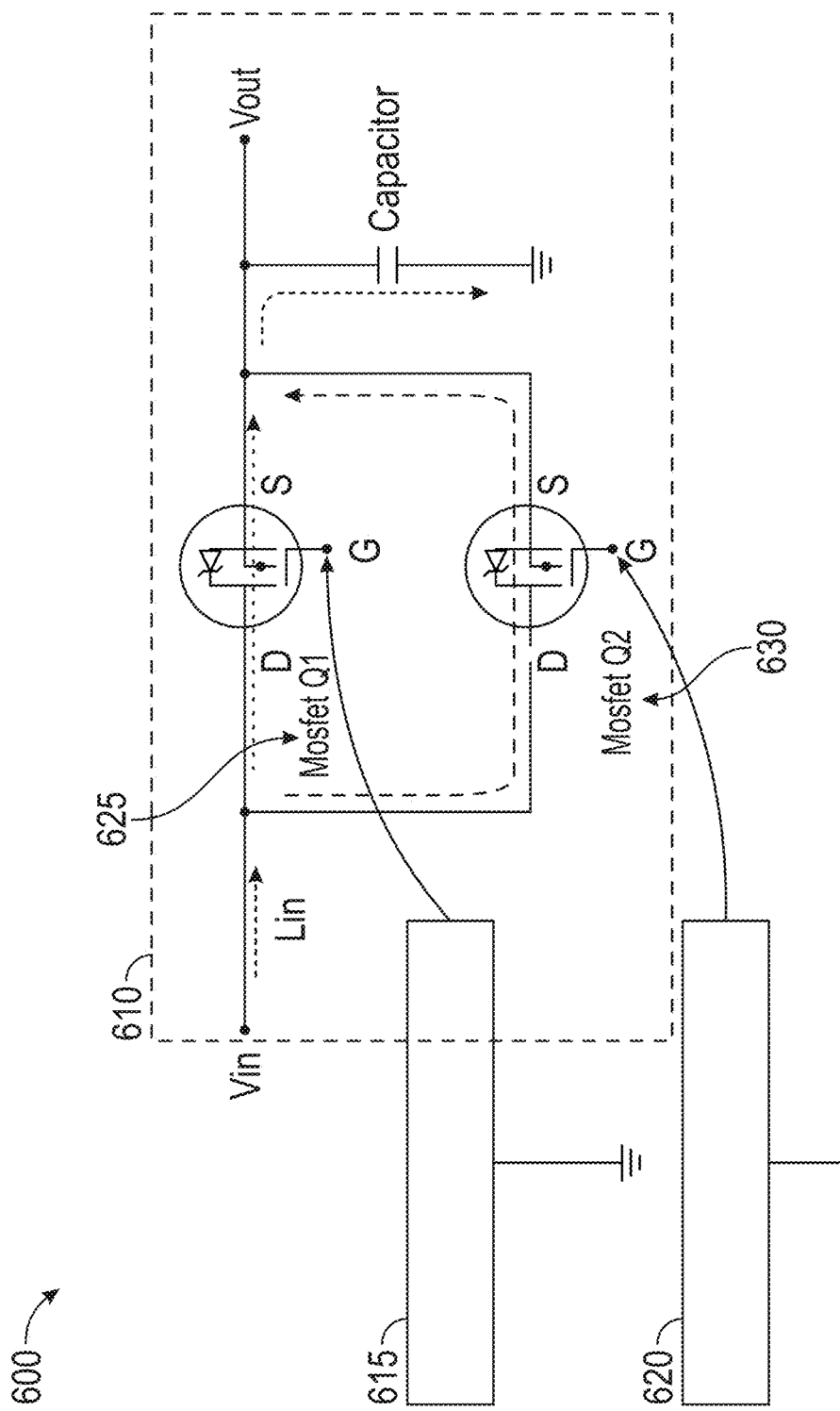
FIG. 6 shows another example of a switch circuit that includes control circuitry for controlling inrush current during circuit ramp-up of a switch circuit that includes parallel MOSFETs and multiple gate drivers, according to an embodiment.

While switching circuit 400 shows a single control circuit is used for operation of the gate drivers 430 and 432, the invention is not limited in this regard. In some embodiments, the control circuitry for each gate driver may be completely distinct. FIG. 6 shows another example of a switch circuit 600 that includes control circuitry 615 and 620 for controlling inrush current during circuit ramp-up of a switch circuit that includes parallel MOSFETs and multiple gate drivers, according to an embodiment. In switch circuit 600, the components shown in circuit 610 function substantially the same as the corresponding components shown in switch circuit 400 (including the gate drivers). However, rather than a single control circuit, such as control circuit 435, two separate controllers 615 and 620 are used to control the gate drivers for MOSFET Q1 625 and MOSFET Q2 630 respectively. In an exemplary embodiment, the controllers 615 and 620 may be hot-swap controllers, such as ADMI 1278 hot-swap controllers, marketed by Analog Devices, Inc., of Cambridge, Mass., USA.

It should be understood that the arrangement of the circuits illustrated in FIGS. 4 and 6 are only two possible implementations and that other arrangements are possible. It should also be understood that the various system components (and means) defined by the claims, described above, and illustrated in the various block diagrams represent logical components that are configured to perform the functionality described herein. In addition, while at least one of these components are implemented at least partially as an electronic hardware component, and therefore constitutes a machine, the other components may be implemented in software, hardware, or a combination of software and hardware. More particularly, at least one component defined by the claims may be implemented at least partially as an electronic hardware component, such as an instruction execution machine (e.g., a processor-based or processor-containing machine) and/or as specialized circuits or circuitry (e.g., discrete logic gates interconnected to perform a specialized function), such as those illustrated in FIGS. 4 and 6. Other components may be implemented in software, hardware, or a combination of software and hardware. Moreover, some or all of these other components may be combined, some may be omitted altogether, and additional components can be added while still achieving the functionality described herein. Thus, the subject matter described herein can be embodied in many different variations, and all such variations are contemplated to be within the scope of what is claimed.

In the description above, the subject matter may be described with reference to acts and symbolic representations of operations that are performed by one or more devices, unless indicated otherwise. As such, it will be understood that such acts and operations, which are at times referred to as being computer-executed, include the manipulation by the processing unit of data in a structured form. This manipulation transforms the data or maintains it at locations in the memory system of the computer, which reconfigures or otherwise alters the operation of the device in a manner well understood by those skilled in the art. The data structures where data is maintained are physical locations of the memory that have particular properties defined by the format of the data. However, while the subject matter is being described in the foregoing context, it is not meant to be limiting as those of skill in the art will appreciate that various of the acts and operation described hereinafter may also be implemented in hardware.

For purposes of the present description, the terms "component," "module," and "process," may be used interchangeably to refer to a processing unit that performs a particular function and that may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

In the description above and throughout, numerous specific details are set forth in order to provide a thorough understanding of the disclosure. It will be evident, however, to one of ordinary skill in the art, that the disclosure may be practiced without these specific details. In other instances, well-known structures and devices are shown in block diagram form to facilitate explanation. The description of the preferred an embodiment is not intended to limit the scope of the claims appended hereto. Further, in the methods disclosed herein, various steps are disclosed illustrating some of the functions of the disclosure. One will appreciate that these steps are merely exemplary and are not meant to be limiting in any way. Other steps and functions may be contemplated without departing from this disclosure.

What is claimed is:

1. A method for controlling inrush current for a system comprising a plurality of metal-oxide-semiconductor field-effect transistors (MOSFETs), the method comprising:
   receiving an inrush current during charging of a capacitor of the system, the system comprising a control circuit communicatively coupled to a plurality of gate drivers, where each gate driver is communicatively coupled to a gate of a different MOSFET of the plurality of MOSFETs coupled in parallel;
   during a first period of a ramp time, causing, using the control circuit via a first gate driver, a greater portion of the inrush current to pass through a first MOSFET of the plurality of MOSFETs relative to a second MOSFET of the plurality of MOSFETs; and
   during a second period of the ramp time, causing, using the control circuit via a second gate driver, a greater portion of the inrush current to pass through the second MOSFET of the plurality of MOSFETs relative to the first MOSFET, the second gate driver having a greater slew rate than the first gate driver.

2. The method of claim 1, where the plurality of MOSFETs comprises two MOSFETs.

3. The method of claim 1, where the plurality of MOSFETs comprises more than two MOSFETs.

4. The method of claim 1, wherein each MOSFET of the plurality of MOSFETs has the same specifications.

5. The method of claim 1, where each gate driver is assigned to a different pin of the switch circuit.

6. A switch circuit that controls inrush current comprising:
   a plurality of metal-oxide-semiconductor field-effect transistors (MOSFETs) coupled in parallel, each MOSFET comprising a source, a drain, and a gate;

a plurality of gate drivers, where each gate driver is communicatively coupled to a gate of a different MOSFET of the plurality of MOSFETs;

a capacitor coupled to the plurality of MOSFETs; and a control circuit communicatively coupled to each of the plurality of gate drivers, wherein when an inrush current is received by the switch circuit during a ramp time to charge the capacitor, the control circuit causes a greater portion of the inrush current to pass through a first MOSFET of the plurality of MOSFETs via a first gate driver of the plurality of gate drivers during a first period of the ramp time relative to a second MOSFET of the plurality of MOSFETs, and the control circuit causes a greater portion of the inrush current to pass through the second MOSFET of the plurality of MOSFETs via a second gate driver of the plurality of gate drivers during a second period of the ramp time relative to the first MOSFET, the second gate driver having a greater slew rate than the first gate driver.

7. The switch circuit of claim 6, where the plurality of MOSFETs comprises two MOSFETs.

8. The switch circuit of claim 6, where the plurality of MOSFETs comprises more than two MOSFETs.

9. The switch circuit of claim 6, wherein each MOSFET of the plurality of MOSFETs has the same specifications.

10. The switch circuit of claim 6, where each gate driver is assigned to a different pin of the switch circuit.

* * * * *